(12) United States Patent
Zuccolotto et al.

(10) Patent No.: US 11,733,338 B2
(45) Date of Patent: Aug. 22, 2023

(54) MRI PHANTOM INCLUDING MRI COMPATIBLE TEMPERATURE MEASUREMENT DEVICE AND PRESSURE EXPANSION BLADDER DEVICE

(71) Applicants: Psychology Software Tools, Inc., Sharpsburg, PA (US); University of Pittsburgh-Of the Commonwealth System of Higher Education, Pittsburgh, PA (US)

(72) Inventors: Anthony P. Zuccolotto, Freeport, PA (US); John Dzikiy, Pittsburgh, PA (US); Leroy K. Basler, Irwin, PA (US); Benjamin A. Rodack, Pittsburgh, PA (US); Walter Schneider, Pittsburgh, PA (US); Sudhir K. Pathak, Pittsburgh, PA (US); Michael A. Boss, Philadelphia, PA (US)

(73) Assignees: PSYCHOLOGY SOFTWARE TOOLS, INC, Sharpsburg, PA (US); UNIVERSITY OF PITTSBURGH—OF THE COMMONWEALTH SYSTEM OF HIGHER EDUCATION, Pittsburgh, PA (US)

(*) Notice: Subject to any disclaimer, the term of this patent is extended or adjusted under 35 U.S.C. 154(b) by 567 days.

(21) Appl. No.: 16/443,323

(22) Filed: Jun. 17, 2019

(65) Prior Publication Data
US 2019/0383895 A1    Dec. 19, 2019

Related U.S. Application Data

(60) Provisional application No. 62/846,223, filed on May 10, 2019, provisional application No. 62/685,994, filed on Jun. 16, 2018.

(51) Int. Cl.
*G01R 33/58* (2006.01)
*G01R 33/48* (2006.01)

(52) U.S. Cl.
CPC ......... *G01R 33/58* (2013.01); *G01R 33/4804* (2013.01)

(58) Field of Classification Search
CPC ............... G01R 33/58; G01R 33/4804; G01R 33/56341; G01R 33/31; A61B 5/055; A61B 5/01; A61B 5/015
See application file for complete search history.

(56) References Cited

U.S. PATENT DOCUMENTS

| 6,409,515 B1 | 6/2002 | Persohn et al. |
| 6,720,766 B2 | 4/2004 | Parker et al. |

(Continued)

FOREIGN PATENT DOCUMENTS

| EP | 2629110 A1 * | 8/2013 | ......... G01R 33/4804 |
| WO | WO-2016007939 A1 * | 1/2016 | ............ A61B 5/055 |
| WO | 2016007939 | 6/2017 | |

*Primary Examiner* — Rishi R Patel
(74) *Attorney, Agent, or Firm* — Blynn L. Shideler; Krisanne Shideler; BLK Law Group

(57) ABSTRACT

An MRI phantom having an MRI compatible temperature measurement device having an MRI compatible body containing an MRI compatible fluid, wherein the device senses accurate temperature measurement within an MR Scanner environment using image processing of the contrast in signal between the areas of the image around the device and the fluid contained within the body of the device. The MRI Phantom may further include an internal expansion bladder device accomodating internal changes in pressure within the phantom, wherein the internal expansion bladder device includes frames supporting a pair of spaced membranes defining a chamber filled with a compressible gas.

14 Claims, 2 Drawing Sheets

(56) References Cited

U.S. PATENT DOCUMENTS

| | | |
|---|---|---|
| 6,744,039 B1 | 6/2004 | DiFilippo |
| 7,521,931 B2 | 4/2009 | Ogrezeanu et al. |
| 7,529,397 B2 | 5/2009 | Wang et al. |
| 7,667,458 B2 | 2/2010 | Yoo et al. |
| 8,076,937 B2 | 12/2011 | Holthuizen et al. |
| 8,134,363 B2 | 3/2012 | Yanasak et al. |
| 8,593,142 B2 | 11/2013 | Mori et al. |
| 8,643,369 B2 | 2/2014 | Krzyzak |
| 9,603,546 B2 | 3/2017 | Horkay et al. |
| 10,078,124 B2 | 9/2018 | Horkay et al. |
| 10,172,587 B2 | 1/2019 | Franke et al. |
| 10,180,483 B2 | 1/2019 | Holdsworth et al. |
| 10,261,161 B2 | 4/2019 | Wang et al. |
| 10,274,570 B2 | 4/2019 | Suh et al. |
| 2006/0195030 A1 | 8/2006 | Ogrezeanu et al. |
| 2007/0069725 A1* | 3/2007 | Kreibich .............. G01R 33/583 324/307 |
| 2007/0124117 A1 | 5/2007 | Zhang |
| 2012/0068699 A1 | 3/2012 | Horkay et al. |
| 2013/0113481 A1 | 5/2013 | Kim et al. |
| 2013/0279772 A1 | 10/2013 | Stedele |
| 2016/0109391 A1* | 4/2016 | Chi ....................... G01N 24/08 324/309 |
| 2016/0363644 A1* | 12/2016 | Wang ..................... G01R 33/58 |
| 2017/0184696 A1 | 6/2017 | Zuccolotto et al. |
| 2017/0242090 A1 | 8/2017 | Horkay et al. |
| 2017/0336490 A1 | 11/2017 | Suh et al. |
| 2018/0085184 A1* | 3/2018 | Bolan .................... A61B 90/39 |
| 2018/0161599 A1 | 6/2018 | Yue |
| 2018/0252790 A1 | 9/2018 | Vesanen et al. |
| 2019/0033419 A1 | 1/2019 | Golay et al. |
| 2019/0271750 A1* | 9/2019 | Mirowski ............ G01K 15/005 |

\* cited by examiner

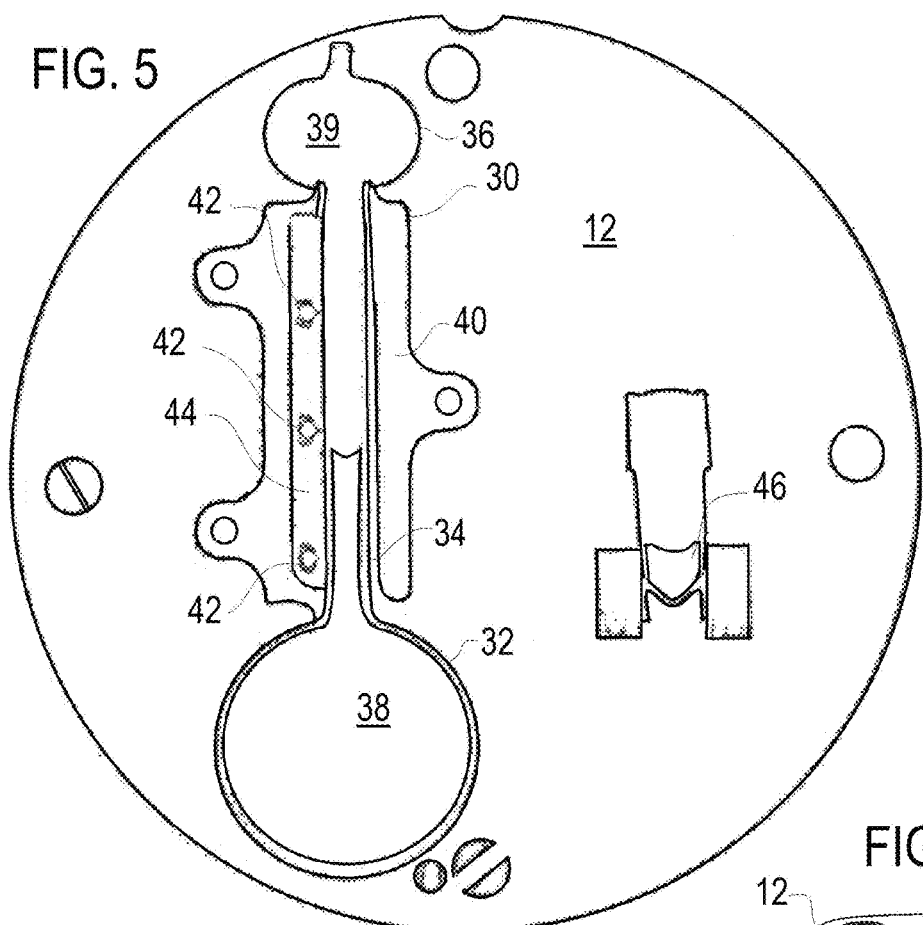
FIG. 5
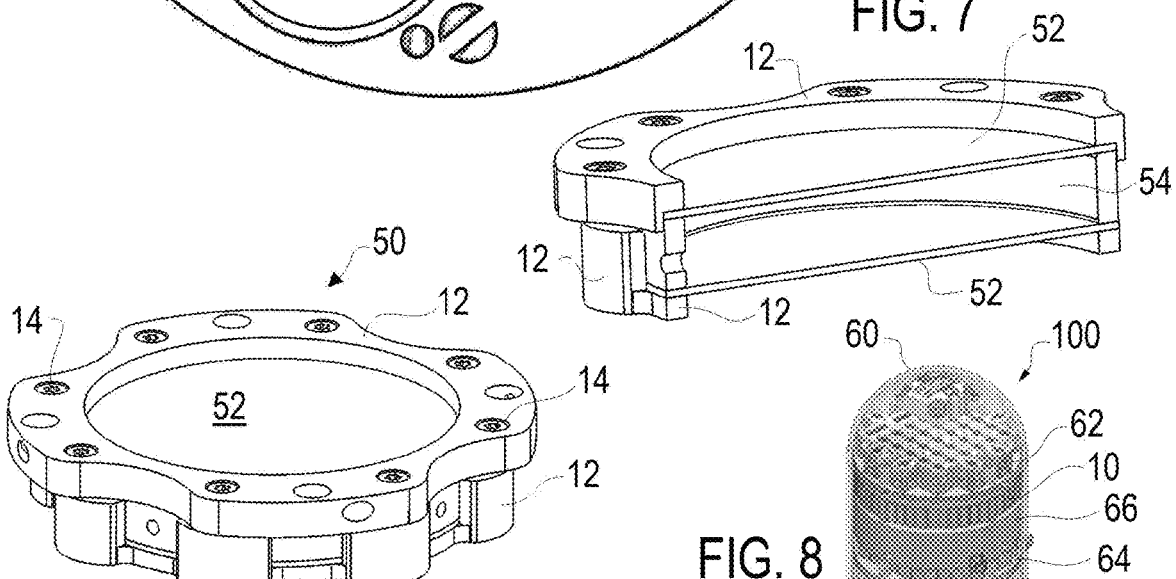
FIG. 7
FIG. 6
FIG. 8

MRI PHANTOM INCLUDING MRI COMPATIBLE TEMPERATURE MEASUREMENT DEVICE AND PRESSURE EXPANSION BLADDER DEVICE

CROSS REFERENCE TO RELATED APPLICATIONS

This application claims the benefit of U.S. Provisional Patent Application Ser. No. 62/685,994 filed Jun. 16, 2018 titled "Anisotropic Homogeneity Phantom including Hollow Integrated Tubular Textile Bundles for Calibrated Anisotropic Imaging; MRI Compatible Temperature Measurement; and Expansion Bladder" which application is incorporated herein by reference.

This application claims the benefit of U.S. Provisional Patent Application Ser. No. 62/846,223 filed May 2, 2019 titled "Anisotropic Homogeneity Phantom including Hollow Integrated Tubular Textile Bundles for Calibrated Anisotropic Imaging; MRI Compatible Temperature Measurement; and Expansion Bladder" which application is incorporated herein by reference.

This application is related to International Application No PCT/US2015/040075 filed on Jul. 11, 2015 and which published Jan. 14, 2016 as Publication WO 2016/007939, and to U.S. patent application Ser. No. 15/403,304 filed on Jan. 11, 2017 and which published Jun. 29, 2017 as U.S. Pat. Publication No. 2017-0184696, which publications are incorporated herein by reference in their entireties.

BACKGROUND INFORMATION

1. Field of the Invention

The present invention relates to an MRI phantom for calibration and validation for anisotropic and isotropic imaging including MRI compatible temperature measurement and expansion bladder.

2. Description of the Related Art

Magnetic Resonance Imaging

Since inception in the 70's, Magnetic Resonance Imaging (MRI) has allowed research and diagnostic imaging of humans and animals. MRI involves using a combination of high strength magnetic fields and brief radio frequency pulses to image tissue, typically by imaging the dipole movement/spin of hydrogen protons. MRI has long provided two and three dimensional imaging of internal tissue, tissue structure, and can provide imaging of functioning processes of tissue called "Functional MRI" or fMRI.

Diffusion MRI (or dMRI), also referred to as diffusion tensor imaging or DTI, is an MRI method and technology which allows the mapping of the diffusion process of molecules, mainly water, in biological tissue non-invasively. Diffusion tensor imaging (DTI) is important when a tissue, such as the neural axons of white matter in the brain or muscle fibers in the heart, has an internal fibrous structure analogous to the anisotropy of some crystals. Water will then diffuse more rapidly in the direction aligned with the internal structure, and more slowly as it moves perpendicular to the preferred direction.

The work in MRI has permitted highly detailed neural pathway mapping, sometimes known tractography or fiber tracking. Tractography or fiber tracking is a 3D MRI modeling technique used to visually represent neural tracts (or other biologic tracts) using data collected by DTI. One MRI technology is known as high definition fiber tracking, or HDFT, and is used to provide extremely highly detailed images of the brain's fiber network accurately reflecting brain anatomy observed in surgical and laboratory studies. HDFT MRI scans can provide valuable insight into patient symptoms and the prospect for recovery from brain injuries, and can help surgeons plan their approaches to remove tumors and abnormal blood vessels in the brain. HDFT is an MRI imaging tool that is based on the diffusion of water through brain cells that transmit nerve impulses. Like a cables of wire, each tract is composed of many fibers and contains millions of neuronal connections. Other MR-based fiber tracking techniques, such as diffusion tensor imaging, cannot accurately follow a set of fibers when they cross another set, nor can they reveal the endpoints of the tract on the surface of the brain.

The instant application references the work discussed at the Schneider Laboratory at the LRDC (http://www.lrdc.pitt.edu/schneiderlab/) for further background on the advancement, current status, and potential of anisotropic imaging and fiber tracking techniques with advanced MRI technologies, which work forms the background for the present invention. Related Publications WO 2016/007939 and U.S. Pat. Pub. No. 2017-0184696, which publications are incorporated herein by reference, provide a detailed background with further source citations in this field. The Schneider Laboratory works with the Neurological Surgery Department at UPMC to visualize fiber tracts within the brain in three dimensions in order to plan the most effective and least damaging pathways of tumor excision in patients suffering from various forms of brain cancer. Additionally, the Schneider Laboratory has utilized HDFT to localize the fiber breaks caused by traumatic brain injuries (TBI), which cannot reliably be seen with the then current standard computed axial tomography (CAT or CT) scans or then available MRI scans in mild traumatic brain injury (mTBI), aiding the diagnosis and prognosis of patient brain trauma.

Others have developed fiber tracking technologies using MRI based scans. Consider, the S. Mark Taper Foundation Imaging Center at Cedars-Sinai which offers diffusion tensor imaging (DTI) fiber tracking and functional (fMRI) motor mapping using magnetic resonance imaging fused with 3D anatomical image of a brain to aid in surgical planning.

Related Publications WO 2016/007939 and U.S. Pat. Publication No. 2017-0184696 discus related background patents in this field including U.S. Pat. Publication No. 2006-0269107, now U.S. Pat. No. 7,529,397 developed by Siemens Medical Solutions USA, Inc.; Johns Hopkins University's U.S. Pat. No. 8,593,142; U.S. Pat. Publication No. 2006-0165308 U.S. Pat. No. 8,076,937, developed by Koninklijke Philips Electronics N.V. of Eindhoven, NL; U.S. Pat. Publication No. 2013-00113481 developed by Samsung Electronics Co. LTD; U.S. Pat. Publication No. 2007-0124117; and U.S. Pat. Publication No. 2013-0279772.

MRI Phantoms

As advanced MRI systems and technologies are developed, tested and/or placed in operation, the accuracy of the technology must be verified or validated. Validation may be defined as process wherein the accuracy of the technology/imaging algorithms is proven or verified. Consider that without proper validation, the most advanced and most detailed fiber tracking systems would be merely devices that make really cool and expensive images without practical application. Further, the accuracy of the associated systems must also be periodically verified, i.e., MRI system periodically calibrated—also referenced as Quality Control aspects, to ensure original and ongoing accurate results and safe operation of the MRI systems.

Generally speaking, calibration and/or test measurements for an MRI system are performed using an imaging phantom or more commonly referenced as simply a phantom. A phantom is any structure that contains one or more known tissue substitutes, or known MRI signal substances, forming one or typically more test points, and often is used to simulate the human body. A tissue substitute is defined as any material that simulates a body of tissue. Thus a phantom may be defined as a specially designed object that is scanned or imaged in the field of medical imaging to evaluate, analyze, and tune the performance of various imaging devices. A phantom is more readily available and provides more consistent results than the use of a living subject or cadaver, and likewise avoids subjecting a living subject to direct risk.

Numerous phantoms have been developed for various imaging techniques. Related Publications WO 2016/007939 and U.S. Pat. Publication No. 2017-0184696 discus related background phantom patents including U.S. Pat. Nos. 8,643,369, 8,134,363, 7,667,458, 7,521,931, 6,744,039, and 6,720,766, and U.S. Pat. No. 6,409,515, U.S. Pat. Pub. Nos. 2018-0161599, 2017-0242090, 2016-0363644, 2012-0068699, and 2006-0195030. See also U.S. Pat. Nos. 10,274,570, 10,261,161, 10,180,483, 10,172,587, 10,078,124, and 9,603,546, and U.S. Pat. Pub. Nos. 2019-0033419; 20180252790 and 2017-0336490. The above identified patents and publications are incorporated herein by reference. Related Publications WO 2016/007939 and U.S. Pat. Publication No. 2017-018696 discus related background phantom articles providing a comprehensive background on phantoms Physical phantoms, as described and discussed above, provide a different balance between ground truth control and realism, to that provided by computer simulations. The above identified patents and patent applications are incorporated herein by reference and the art firmly establish the continued need for effective MRI phantoms for anisotropic and isotropic imaging for validating and calibrating fiber tracking technologies and systems. Some aspects of MRI phantoms can be temperature dependent or variable. Historically there is an assumption that the phantom has achieved the desired measurement temperature, which may not be ambient. However verification of temperature compliance in an MRI phantom would be helpful. Further pressure variations can occur within the phantoms, particularly when heating the phantom from ambient temperature to human body temperature, and also in shipping, and failure to accommodate such pressure variations can damage the phantom or significantly shorten the operational life of a phantom.

SUMMARY OF THE INVENTION

Some aspects of the present invention will address fiber tracking phantoms, and the present application is defining certain terms to be used herein. The term "taxon" is defined within this application as a textile based axon simulation having an outer diameter of less than 50 microns and an inner diameter of less than 20 microns, often much smaller than this. Thus a taxon can be considered a single tube, often filled with fluid. The phrase "taxon fiber" is defined within this application as a collection or bundle of taxons, and the taxon fiber may be formed with integral taxons that share outer walls. The phrase "taxon filament" is defined within this application as a taxon fiber with peripheral modification, such as placing a sheath around a bundle of taxons that form a taxon fiber, or trimming/shaping the edges of a taxon fiber to form a polygon taxon filament that allows for tighter packing. The phrase "taxon ribbon" is defined within this application as a bundled or attached collection of taxon fibers or taxon filaments, typically taxon filaments.

One aspect of this invention is directed to a cost effective, efficient, MRI phantom having an internal expansion bladder device accomodating internal changes in pressure within the phantom, wherein the internal expansion bladder device includes frames supporting a pair of spaced membranes defining a chamber filled with a compressible gas.

One aspect of this invention is directed to a cost effective, efficient, MRI phantom having an MRI compatible temperature measurement device having an MRI compatible body containing an MRI compatible fluid, wherein the device senses accurate temperature measurement within an MR Scanner environment using image processing of the contrast in signal between the areas of the image around the device and the fluid contained within the body of the device.

These and other aspects of the present invention will be clarified in the following description of the preferred embodiments taken together with the attached figures in which like reference numerals represent like elements throughout.

BRIEF DESCRIPTION OF THE SEVERAL VIEWS OF THE DRAWINGS

FIG. 5 is a representative sketch of an MRI image of the MRI compatible temperature measurement device and frame of FIG. 4;

FIG. 6 is a perspective view of a bladder expansion device according to one aspect of the present invention;

FIG. 7 is a perspective sectional view of the bladder expansion device of FIG. 6; and FIG. 8 is a perspective view of a modular MRI phantom including the MRI compatible temperature measurement device and expansion bladder device according to the present invention.

BRIEF DESCRIPTION OF THE PREFERRED EMBODIMENTS

Figure 1:
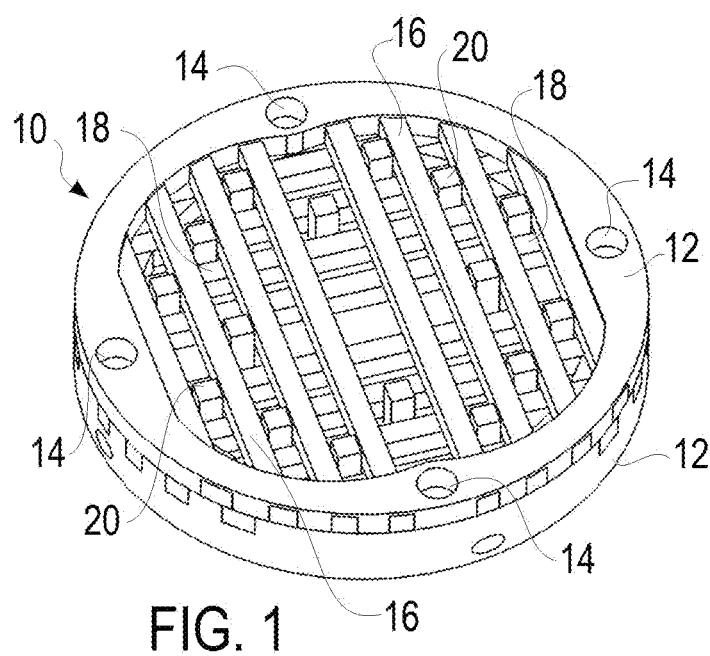
FIG. 1 is a perspective view of a representative testing segment or disc of an MRI phantom that may include an MRI compatible temperature measurement device and expansion bladder device according to the present invention.
Figure 2:
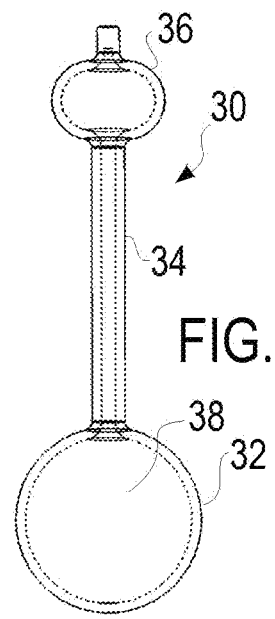
FIG. 2 is a top view of the body of an MRI compatible temperature measurement device according to one aspect of the present invention.
Figure 3:
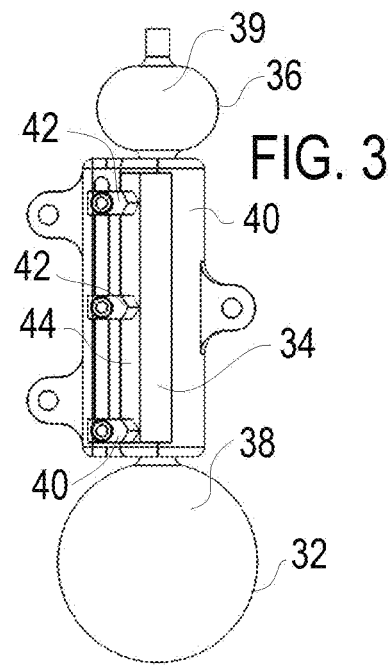
FIG. 3 is a top view of the MRI compatible temperature measurement device according to FIG. 2 with a frame.

The present invention relates to an MRI phantom for calibration and validation including MRI compatible temperature measurement device 30 and compensating for expansion within the phantom with an expansion bladder device 50, also known as a pressure accommodator 50. As outlined in U.S. Pat. Pub. No. 2017-0184696 many MRI phantoms are modular with sections of distinct testing segments. FIG. 1 illustrates a representative testing segment or disc 10. A key challenge throughout MRI is getting measurements that are quantitatively stable across space. There are added challenges in anisotropic calibration addressing X, Y, and Z dimensions. The disc 10 shown in FIG. 1 is may be described as an anisotropic homogeneity phantom having frame members 12 coupled with fasteners 14 that support fiber tracks 16, 18 and 20 extending in mutually orthogonal directions. The tracks 16, 18 and 20 may be formed as taxon ribbons. As noted in U.S. Pat. Pub. No. 2017-0184696 taxons (textile fibers in that application) may be formed into taxon fibers (also called fascicle therein) and the taxon fibers may be combined into taxon ribbons (or tracks). FIG. 1 shows that the taxon ribbons may form the specific XY and Z tracks 16, 18 and 20 that are supported in the fixed frames 12 within the phantom disc 10. FIG. 1 is merely one representative disc of many types that may be used in a phantom. Other known disc types would include fiber crossing phantom discs, fiber routing phantom discs, fiber density phantom discs. A host of non-fiber related phantom discs can be implemented as known in the art.

MRI Compatible Temperature Measurement Device 30

One aspect of this invention is directed to a cost effective, efficient, MRI phantom for calibrated anisotropic imaging including an MRI compatible temperature measurement device 30 also known as an MR Readable Thermometer 30 which senses accurate temperature measurement within an MR Scanner environment using image processing of the contrast/difference in signal (or lack thereof) between the areas of the image around the thermometer 30 and the fluid 38 contained within the body of the thermometer 30. The body of the thermometer 30 may be formed of the material such as glass which is suitable for MRI environment that does not interfere with the signal and can accommodate the fluid 38 such as acetone.

The bulb 32 is the lowest part of the thermometer 30, which has a spherical shape in this embodiment, however any large reservoir shape should be sufficient. This section of the thermometer 30 acts as a reservoir to hold indicator fluid 38, such as acetone, which stays in liquid form within the thermometer 30 in ordinary operating conditions.

Fluids other than acetone may be used as the fluid 38, however the fluid chosen must be MR safe (e.g., not ferrous and non-metallic), must not distort the resulting MR image (e.g., suceptibility artifacts), and must have a resulting signal that is sufficiently different from the surounding material so as to reliably detect the line of separation between the fluid 38 vs non-fluid areas. The fluid 38 chosen must provide sufficient expansion under heating conditions within the target measurement range of the thermometer. Likewise, the fluid expansion per rate of temperature change must be large enough in the capilary 34 to assure a minimal amount of volume change sufficent to move the line of separation between the fluid 38 vs non-fluid areas over the physical distance necessary to be detected by imaging processsing, e.g., the fluid 38 must ultimately rise at least 1 mm, and preferably about 3 mm, within the capillary 34 per degree Celsius in order to reliably detect a change in temperature. Within typically operating conditions/enviroments of an MR Scanner room, acetone has shown to sufficiently address all of the requirements above.

The capillary 34 of the thermometer 30 is the long cylindrical tube that is connected to the bulb 32. As temperature increases, the fluid (acetone) 38 flows up the capillary 34. The further the fluid 38 moves up the capillary 34, the higher the measured temperature. The capillary 34 ends in a section known as the expansion chamber 36. The voxel resolution of typical 1.5 T/3 T/7 T MR Scanners, and the related scanning sequences/protocols, is typically 1 mm-5 mm. Thus a reliably temperature reading requires the volume/area of interest within the capilary 34 of the thermometer to be a relatively large diameter in comparison to typical human readable body thermometers (aka mercury thermometers).

The expansion chamber 36 of the thermometer 30 can be found at the top of the capillary 34. The function of the expansion chamber 36 is to form a larger volume through which the fluid 38 can fill if the maximum temperature scale is exceeded. It is undesirable for fluid 38 to reach the expansion chamber 36 since it means the thermometer 30 is no longer sensitive to increases in temperature in ways that can be easily detected.

Due to the large diameter of the MR thermometer capillary 34 (relative to a mercury thermometer), a fluid, such as acetone, must be selected to that will quickly and reliably "reassemble" when/if the unit/device containing the thermometer 30 is stored in an orientation that would cause the fluid 38 to separate into multiple sub sections of fluid or "slugs".

The non-fluid space of the thermometer 30 must be filled with a substance 39 (e.g., nitrogen) that will not emit a confounding signal or image distortion due to suceptibilty artifacts.

A frame 40 is used to couple the thermometer 30 to the other elements of the MRI phantom, such as to an adjacent frame 12 of a disk. The thermometer can be located in any convenient place within an MRI phantom. The frame 40 further includes fiducials 42 on a calibrated scale 44 that need to be present and visible in the image together with the capillary 34 and the fluid 38 so that image processing software can compare the relatively distances between the fluid level and the preset fiducials 42 relative to the scale 44 in order to compute the temperature value. Because of the large diameter of the thermometer and the expansion coefficient of the fluid (acetone or similar), a larger than typical bolus of fluid would exist within the body of the thermometer 30 as compared to a human mercury thermometer.

Figure 4:
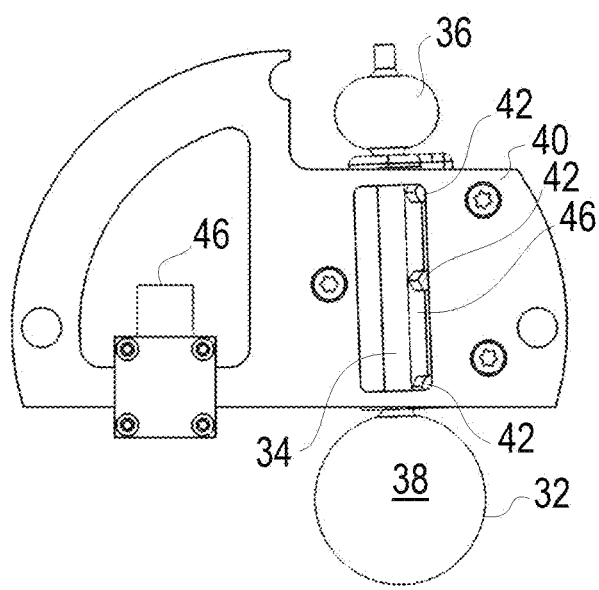
FIG. 4 is a rear view of the MRI compatible temperature measurement device according to FIG. 2 with another frame and liquid calibration member.

The frame 40 as shown in the embodiment of FIG. 4 can include a separate chamber of fluid 46 that can act to orientate the thermometer 30. FIG. 5 is a representative sketch of an MRI image of the MRI compatible temperature measurement device 30 and frame 40 of FIG. 4. The chamber of fluid 46 is visible and can identify the orientation of the device 30. Further as shown in FIG. 5 the seperation between the fluid 38 and gas 39 is visible in the MRI image as well as the scale 44 and the fiducials 42, thus the image processing can determine the temperature reading in the MRI environment. The device 30 is intended to be coupled to any MRI phantom type as desired, however in a sense the device 30 is a pahntom itself allowing the system to calibrate temperature within the environment.

Phantom Internal Expansion Bladder Device

The internal expansion bladder device 50 or pressure accumulator of the present inventions adjusts for internal changes in pressure within an MR Phantom. Pressure changes can be the result of heating/cooling during use of a phantom, changes in ambient temperature during storage or transport, changes in pressure during shipment (air cargo, use at different altitudes). Changes in pressure within a phantom rigid body (which is typically filled with water or similar liquid) can cause leaks around gasket seals if not compensated for in the system. The internal expansion bladder device 50 of the present invention allows for this compensation when coupled to an MRI device. For the disc shaped subcomponets of a phantom such as shown in FIG. 1 the internal expansion bladder device 50 can be formed as a disc shaped device as shown in FIGS. 6-7. The device 50 includes frames 12 as discussed above and a pair of spaced 52 membranes defining a chamber filled with a relatively compressible gas 54.

The materials of the frames 52 and flexible membranes 52 must be MR safe, non-ferrous, non-metalic, and cannot produce image artifacts or susceptibility artifacts. The space in the bladder must be filled with a gas 54 e.g., nitrogen, or possibly liquid substance, that can compress more than the water surrounding the device 50. This substance cannot disrupt the MR signal.

The device 50 may be used with the device 30 together with the phantom disc 10 together with any number of other discs desired for a particular phantom. FIG. 8 is a perspective view of a modular MRI phantom 100 including the MRI compatible temperature measurement device 30 and expansion bladder device 50 according to the present invention. The phantom 100 includes a readable serial number 60 to identify the device and a biophysics disc 62, a reference fluid disc 64, and an anatomical disc 66 in addition to the spatial homogeneity disc 10 discussed above. The construction of the biophysics and reference fluid and anatomical phantom test points are generally known in the art.

It is apparent that many variations to the present invention may be made without departing from the spirit and scope of the invention. The present invention is defined by the appended claims and equivalents thereto.

What is claimed is:

1. An MRI phantom having at least one disc comprising test points for calibration and validation and an MRI compatible temperature measurement device coupled to the at least one disc and having an MRI compatible body containing an MRI compatible fluid, wherein the temperature measurement device is configured for accurate temperature measurement within an MR Scanner environment using image processing of a contrast in signal obtained by the MR Scanner environment between areas of an MR image of the MRI phantom around the temperature measurement device and the MRI compatible fluid contained within the MRI compatible body of the temperature measurement device, wherein the MRI compatible body includes a bulb at one end of the MRI compatible body, wherein said bulb is a reservoir for the MRI compatible fluid, wherein the MRI compatible body includes a capillary formed as a long cylindrical tube that is connected to the bulb, wherein the MRI compatible body includes an expansion chamber, wherein the capillary ends in the expansion chamber, wherein as temperature increases, the MRI compatible fluid flows up the capillary, and wherein the capillary is sized whereby an MRI compatible fluid thermal expansion per rate of temperature change of the MRI compatible fluid within the capillary is at least 1 mm per degree Celsius change.

2. The MRI phantom according to claim 1, wherein the capillary is sized whereby the MRI compatible fluid expansion per rate of temperature change of the MRI compatible fluid within the capillary is at least 3 mm per degree Celsius change.

3. The MRI phantom according to claim 2, wherein the MRI compatible fluid is not ferrous and non-metallic and does not distort any MR image of the MRI Phantom.

4. The MRI phantom according to claim 2, wherein the MRI compatible fluid is acetone.

5. The MRI phantom according to claim 2 wherein the at least one disc comprising test points for calibration and validation includes a plurality of discs with distinct test points whereby the MRI phantom is modular with sections of distinct testing segments.

6. The MRI phantom according to claim 5 including one phantom section formed as an anisotropic homogeneity phantom having frame members that support fiber tracks extending in mutually orthogonal directions.

7. The MRI phantom according to claim 5, further including an internal expansion bladder device accommodating internal changes in pressure within the phantom.

8. TOhe MRI phantom according to claim 7 wherein the internal expansion bladder device includes frames supporting a pair of spaced membranes defining a chamber filled with a compressible gas.

9. An MRI phantom having at least one disc comprising test points for calibration and validation and an internal expansion bladder device accommodating internal changes in pressure within the MRI phantom, wherein the internal expansion bladder device includes frames supporting a pair of spaced membranes defining a chamber filled with a compressible gas, wherein the compressible gas is nitrogen, wherein the MRI phantom further includes an MRI compatible temperature measurement device having an MRI compatible body containing an MRI compatible fluid, wherein the temperature measurement device senses accurate temperature measurement within an MR Scanner environment using an MR image processing of a contrast in signal obtained by the MR Scanner environment between areas of an MR image around the temperature measurement device and the MRI compatible fluid contained within the body of the temperature measurement device, wherein the MRI compatible body includes a bulb at one end of the MRI compatible body, wherein said bulb is a reservoir for the MRI compatible fluid, wherein the MRI compatible body includes a capillary formed as a long cylindrical tube that is connected to the bulb, wherein as temperature increases, the fluid flows up the capillary, and wherein the capillary is sized whereby a MRI compatible fluid expansion per rate of temperature change of the MRI compatible fluid within the capillary is at least 1 mm per degree Celsius change.

10. The MRI phantom according to claim 9, wherein the capillary is sized whereby the MRI compatible fluid expansion per rate of temperature change of the MRI compatible fluid within the capillary is at least 3 mm per degree Celsius change.

11. The MRI phantom according to claim 9, wherein the MRI compatible fluid is acetone.

12. The MRI phantom according to claim 9, wherein the at least one disc comprising test points for calibration and validation includes a plurality of discs with distinct test points whereby the MRI phantom is modular with sections of distinct testing segments, and including one phantom section formed as an anisotropic homogeneity phantom having frame members that support fiber tracks extending in mutually orthogonal directions.

13. An MRI phantom having at least one disc comprising test points for calibration and validation and an internal expansion bladder device accommodating internal changes in pressure within the MRI phantom, wherein the internal expansion bladder device includes frames supporting a pair of spaced membranes defining a chamber filled with a compressible gas, wherein the MRI phantom further includes an MRI compatible temperature measurement device having an MRI compatible body containing an MRI compatible fluid, wherein the temperature measurement device senses accurate temperature measurement within an MR Scanner environment using an MR image processing of a contrast in signal obtained by the MR Scanner environment between areas of an MR image around the temperature measurement device and the MRI compatible fluid contained within the body of the temperature measurement device, wherein the MRI compatible body includes a bulb at one end of the MRI compatible body, wherein said bulb is a reservoir for the MRI compatible fluid, wherein the MRI compatible body includes a capillary formed as a long cylindrical tube that is connected to the bulb, wherein the MRI compatible body includes an expansion chamber, wherein the capillary ends in the expansion chamber wherein as temperature increases, the fluid flows up the capillary, and wherein the capillary is sized whereby a MRI compatible fluid expansion per rate of temperature change of the MRI compatible fluid within the capillary is at least 1mm per degree Celsius change, and wherein the at least one disc comprising test points for calibration and validation includes a plurality of discs with distinct test points whereby the MRI phantom is modular with sections of distinct testing segments, and including one phantom section formed as an anisotropic homogeneity phantom having frame members that support fiber tracks extending in mutually orthogonal directions.

14. The MRI phantom according to claim 13 including one phantom section formed as an anisotropic homogeneity phantom having frame members that support fiber tracks extending in mutually orthogonal directions.

\* \* \* \* \*